United States Patent
Haig et al.

(10) Patent No.: US 7,595,657 B2
(45) Date of Patent: Sep. 29, 2009

(54) DYNAMIC DUAL CONTROL ON-DIE TERMINATION

(75) Inventors: Robert Haig, Austin, TX (US); Patrick T. Chuang, Cupertino, CA (US)

(73) Assignees: Sony Corporation, Tokyo (JP); Sony Electronics Inc., Park Ridge, NJ (US)

( * ) Notice: Subject to any disclaimer, the term of this patent is extended or adjusted under 35 U.S.C. 154(b) by 0 days.

(21) Appl. No.: 12/078,782

(22) Filed: Apr. 4, 2008

(65) Prior Publication Data
US 2008/0272800 A1 Nov. 6, 2008

Related U.S. Application Data

(60) Provisional application No. 60/927,262, filed on May 1, 2007.

(51) Int. Cl.
*H03K 17/16* (2006.01)
*H03K 19/003* (2006.01)
(52) U.S. Cl. ............... 326/30; 326/86; 326/90
(58) Field of Classification Search ........... 326/30, 326/86, 90
See application file for complete search history.

(56) References Cited

U.S. PATENT DOCUMENTS

| | | | | |
|---|---|---|---|---|
| 5,467,455 | A * | 11/1995 | Gay et al. | 710/100 |
| 7,092,299 | B2 | 8/2006 | Kwak et al. | |
| 7,138,823 | B2 | 11/2006 | Janzen et al. | |
| 7,154,295 | B2 | 12/2006 | Choe | |
| 2006/0062039 | A1 | 3/2006 | Ruckerbauer et al. | |
| 2006/0255830 | A1 | 11/2006 | Kim | |
| 2007/0073506 | A1* | 3/2007 | Boskovic | 702/107 |
| 2007/0126465 | A1 | 6/2007 | Cox et al. | |

OTHER PUBLICATIONS

Latice Semiconductor Corporation, "LatticeSC DDR/DDR2 SDRAM Memory Interface User's Guide", http://www.latticesemi.com/dynamic/view_document.cfm?document_id+19020, pp. 1-34, Jul. 2007.

Tektronix, "Fundamentals of SDRAM Memory", http://www.iuma.ulpgc.es/~nunez/clases-microcontrollers/Embedded-Memory-Design-SDRAM-DDR2-3Tek.pdf, pp. 1-24.

(Continued)

*Primary Examiner*—Anh Q Tran
(74) *Attorney, Agent, or Firm*—Rader, Fishman & Grauer PLLC; Christopher M. Tobin

(57) ABSTRACT

Controlling on-die termination on a bi-directional single-ended data bus carrying data between a controller and a memory device. The controller and the memory device respectively include input termination pull-ups and input termination pull-downs. An enabled state is maintained for the input termination pull-downs of the controller except when data is driven on the bi-directional single ended data bus by the controller. Similarly, an enabled state is maintained for the set of input termination pull-downs of the memory device except when data is driven on the bi-directional single ended data bus by the memory device. In conjunction with this, a disabled state is maintained for the input termination pull-ups of the memory device (or controller) except when data is being received from the bi-directional single-ended data bus by the memory device (or controller).

26 Claims, 7 Drawing Sheets

OTHER PUBLICATIONS

Mike Black, "Xilinx/Micron Partner to Provide High-Speed Memory Interfaces", http://63.241.181.135/publications/solguides/mi_01/xc_pdf/p16-17_1mi-micron.pdf, pp. 16-17, Mar. 2006.

Samsung Electronics, "512Mb M-die DDR-II SDRAM Specification Version 0.11 ODT (on Die Termination)", http://archive.chipcenter.com/memory/prod022.html, pp. 1-5, Apr. 2002.

* cited by examiner

| SA | $\overline{LD}$ | $\overline{R/W}$ | Operation | DQ Input | DQ Output |
|---|---|---|---|---|---|
| ↑K ($t_n$) | ↑K ($t_n$) | ↑K ($t_n$) | ($t_n$) | ↑K ($t_n$+WL) | ↑K ($t_n$+RL) |
| X | 1 | X | NOP | X | High-Z |
| V | 0 | 0 | Write | Write Data In | High-Z |
| V | 0 | 1 | Read | X | Read Data Out |

202 — SA
204 — $\overline{LD}$
206 — $\overline{R/W}$
208 — DQ Input
210 — DQ Output

| | SRAM DQ State 402 | | | | Controller DQ State 404 | | | | Resulting DQ Signal Voltage 406 |
|---|---|---|---|---|---|---|---|---|---|
| | Driver | | Termination | | Driver | | Termination | | |
| | PD | PU | PD | PU | PD | PU | PD | PU | |
| During NOP | Off | Off | On | Off | Off | Off | On | Off | $DQ = V_{SS}$ |
| Shortly Before Read | Off | Off | On | Off | Off | Off | On | On | $V_{SS} < DQ < V_{DDQ}/2$ |
| During Read "0" | On | Off | Off | Off | Off | Off | On | On | $V_{SS} < DQ < V_{DDQ}/2$ |
| During Read "1" | Off | On | Off | Off | Off | Off | On | On | $V_{DDQ}/2 < DQ < V_{DDQ}$ |
| Immediately After Read | Off | Off | On | Off | Off | Off | On | On | $V_{SS} < DQ < V_{DDQ}/2$ |
| Shortly After Read | Off | Off | On | On | Off | Off | On | Off | $DQ = V_{SS}$ |
| Shortly Before Write | Off | Off | On | On | Off | Off | On | Off | $V_{SS} < DQ < V_{DDQ}/2$ |
| During Write "0" | Off | Off | On | On | On | Off | On | Off | $V_{SS} < DQ < V_{DDQ}/2$ |
| During Write "1" | Off | Off | On | On | Off | On | Off | Off | $V_{DDQ}/2 < DQ < V_{DDQ}$ |
| Immediately After Write | Off | Off | On | Off | Off | Off | On | Off | $V_{SS} < DQ < V_{DDQ}/2$ |
| Shortly After Write | Off | Off | On | Off | Off | Off | On | Off | $DQ = V_{SS}$ |

FIG. 4

| SA $\uparrow K$ ($t_n$) | $\overline{LD}$ $\uparrow K$ ($t_n$) | R/$\overline{W}$ $\uparrow K$ ($t_n$) | Operation ($t_n$) | DQ Driver | | DQ Termination | |
|---|---|---|---|---|---|---|---|
| | | | | PD $\uparrow K$ ($t_n$+RL) | PU $\uparrow K$ ($t_n$+RL) | PD $\uparrow K$ ($t_n$+RL) | PU $\uparrow K$ ($t_n$+PUL) |
| X | 1 | 0 | NOPw | Off | Off | On | On |
| X | 1 | 1 | NOPr | Off | Off | On | Off |
| V | 0 | 0 | Write | Off | Off | On | On |
| V | 0 | 1 | Read "0" | On | Off | Off | Off |
| | | | Read "1" | Off | On | | |

FIG. 5

DYNAMIC DUAL CONTROL ON-DIE TERMINATION

CROSS REFERENCE TO RELATED APPLICATIONS

This application claims priority under 35 U.S.C. §119 to U.S. provisional application Ser. No. 60/927,262, filed on May 1, 2007 and entitled "Dynamic Dual-Control ODT," the entire contents of which are hereby incorporated by reference.

BACKGROUND OF THE INVENTION

1. Field of the Invention

This invention relates generally to dynamic dual control on-die termination and more particularly to controlling on-die termination on a bi-directional, single ended data bus in high speed memory devices.

2. Description of the Related Art

When on-die termination is implemented by both the SRAM and Controller on a high-speed bi-directional data bus, bus contention must be avoided (as with any bi-directional data bus) without allowing the data bus to float (or be pulled) to the midpoint of the signal voltage swing.

Furthermore, the mechanism used to ensure that this requirement is met should not, ideally, require the addition of any control signals to the SRAM, and should be usable regardless of the Read and Write Latencies of the SRAM, and regardless of the transmission delay from Controller to SRAM (and SRAM to Controller).

FIG. 1 is a schematic diagram illustrating on-die termination on a bi-directional data signal between SRAM 140 and Controller 120. Synchronous SRAM is a Static Random Access Memory device having an input clock that is used to (1) Latch address, control, and write data signals driven to the SRAM 140, and (2) Control the output timing of read data signals driven from the SRAM 140. A Controller 120 is a component (e.g., an ASIC, FPGA, or other similar device) used to access the SRAM 140. The Controller initiates Write operations to store (write) data in the SRAM, and Read operations to retrieve (read) data from the SRAM.

A Bi-Directional Data Bus is a group of bi-directional transmission lines that is used by the Controller to both (1) Send multiple bits of write data, in parallel, to the SRAM during Write operations, and (2) Receive multiple bits of read data, in parallel, from the SRAM during Read operations. A Single-Ended Data Bus is a data bus where each data bit is associated with a single transmission line. In the described context, Common I/O (CIO) SRAM refers to a synchronous SRAM with a bi-directional, single-ended data bus.

Still referring to FIG. 1, a number of voltages are illustrated. $V_{DDQ}$ is the supply voltage used to power the SRAM 140 and Controller 120 I/O interfaces. $V_{SS}$ is the ground reference voltage used for the SRAM and Controller I/O interfaces. Typically, $V_{SS}$=0V. $V_{REF}$ is the fixed reference voltage used by the SRAM and the Controller to control the switch point of a differential amplifier when it is used to receive a single-ended input signal. Typically, $V_{REF}$ is set to the mid-point of the input signal voltage swing—i.e., $V_{DDQ}/2$ when the input signal swings from $V_{SS}$ (0V) to $V_{DDQ}$ nominally.

Differential amplifiers are electrical devices frequently used as an input receiver for receiving high-frequency single-ended input signals, as illustrated in FIG. 1. The differential amplifier has two inputs: "+" and "−", and one output: "Y". When the voltage applied to the "+' input is greater than the voltage applied to the "−" input, the "Y" output is "high". Conversely, when the voltage applied to the "+" input is less than the voltage applied to the "−" input, the "Y" output is "low". When a differential amplifier is used to receive a single-ended input signal, the "+" input is connected to the input signal, and the "−" input is connected to $V_{REF}$.

On-Die Termination (ODT) is an input termination that is implemented on-chip, on one or more input signals. By way of example, the on-die termination includes a pull-up device (or multiple devices, often transistors), connected between $V_{DDQ}$ and a particular input signal, and a pull-down device (or multiple devices, often transistors), connected between VSS and the same input signal. ODT controls and limits the voltage swing of the input signal, enabling higher-frequency data transmission between components than would otherwise be possible without ODT. With bi-directional data signals, ODT is implemented on each individual data input receiver in the SRAM 140, for receiving write data from the Controller 120, as well as on each individual data input receiver in the Controller, for receiving read data from the SRAM 140.

FIG. 2 is a table 200 illustrating an example of a CIO SRAM Clock Truth Table. A typical CIO SRAM has a clock input signal, which is often abbreviated as "K" or "CK"; multiple synchronous address input signals, often abbreviated "SA" (column 202); multiple Synchronous Data Input/Output signals, often abbreviated "DQ" (columns 208, 210); and two Synchronous Control Input signals, which are (1) Synchronous Enable, which is typically active "low", often abbreviated "$\overline{LD}$" or "$\overline{SS}$" or "$\overline{E}$" (column 204), and (2) Synchronous Read/Write Select, often abbreviated "R/$\overline{W}$" or "$\overline{SW}$" or "$\overline{W}$" (column 206).

In the Truth Table, (1) "1"=input "high"; "0"=input "low"; "V"=input "valid"; "X"=input "don't care"; (2) "High-Z" indicates that the DQ output driver is disabled; (3) "RL" refers to the "Read Latency" of the SRAM. That is, how many cycles it takes from when the SRAM detects a Read operation to when it begins to send read data to the Controller; and (4) "WL" refers to the "Write Latency" of the SRAM. That is, how many cycles it takes from when the SRAM detects a Write operation to when it begins to sample write data from the Controller.

When the SRAM samples Synchronous Enable "high", it executes a NOP operation (i.e., neither a Read nor a Write operation), regardless of the state of Synchronous Read/Write Select. When the SRAM samples Synchronous Enable "low", it executes a Read operation if it samples Synchronous Read/Write Select "high", or a Write operation if it samples Synchronous Read/Write Select "low".

There is a problem when a bi-directional bus is utilized in configurations such as that described above. Because a bi-directional bus is utilized for data transmission, the SRAM should at a minimum (1) have its DQ input termination fully enabled before it begins receiving data on the bus, and kept fully enabled until after it has finished receiving data on the bus; and (2) Have its DQ input termination fully disabled while driving data on the bus. The Controller must also do the same.

During this enable/disable process, a condition may arise where both the SRAM and Controller have disabled their DQ output drivers, and one (or both) of them has enabled its DQ input termination. If this occurs, and the pull-up and pull-down termination impedances are the same, the DQs will be pulled to $V_{DDQ}/2=V_{REF}$ by the input termination. This situation (i.e., DQ steady-state voltage=$V_{REF}$) must be avoided, because it can cause the differential amplifier to enter a metastable state, resulting in high current and potential electrical damage to the components.

What is needed is enabling and disabling DQ input termination in a CIO SRAM (and in the Controller as well) in such a way that the DQs are not pulled to VREF under circumstances such as those described above.

SUMMARY OF THE INVENTION

Controlling on-die termination on a bi-directional single-ended data bus carrying data between a controller and a memory device. The controller and the memory device respectively include input termination pull-ups and input termination pull-downs. An enabled state is maintained for the input termination pull-downs of the controller except when data is driven on the bi-directional single ended data bus by the controller. Similarly, an enabled state is maintained for the set of input termination pull-downs of the memory device except when data is driven on the bi-directional single ended data bus by the memory device.

In conjunction with this, a disabled state is maintained for the input termination pull-ups of the memory device (or controller) except when data is being received from the bi-directional single-ended data bus by the memory device (or controller). According to one alternative, timing parameters are used to ensure that the input termination pull-ups are disabled except while receiving data. According to another alternative, the read/write input control signal is used to ensure that the input termination pull-ups are disabled except while receiving data.

The present invention can be embodied in various forms, including business processes, computer implemented methods, computer program products, computer systems and networks, user interfaces, application programming interfaces, and the like.

BRIEF DESCRIPTION OF THE DRAWINGS

These and other more detailed and specific features of the present invention are more fully disclosed in the following specification, reference being made to the accompanying drawings, in which:

FIG. 2 is a table illustrating an example of a CIO SRAM Clock Truth Table.

FIG. 4 is a table illustrating an example of the states of the Controller and SRAM and corresponding DC voltages.

FIG. 5 is a table illustrating an example of a CIO SRAM DQ Output Driver and DQ Input Termination Clock Truth Table wherein Dynamic Dual Control ODT is implemented.

DETAILED DESCRIPTION OF THE INVENTION

In the following description, for purposes of explanation, numerous details are set forth, such as flowcharts and system configurations, in order to provide an understanding of one or more embodiments of the present invention. However, it is and will be apparent to one skilled in the art that these specific details are not required in order to practice the present invention.

One way of addressing the above-described problems is through an electrical skew solution. In such a solution, a configuration is provided to make the pull-up and pull-down termination impedances the same, but make $V_{REF}=V_{DDQ}/2\pm\Delta V$. Alternatively, one could make $V_{REF}=V_{DDQ}/2$, but make the pull-up and pull-down termination impedances different, such that, when the DQ signal is not driven, the combination of impedances would pull it to $V_{DDQ}/2+\Delta V$.

In either case, there would be some $\Delta V$ voltage difference at the differential amplifier inputs when the DQ output drivers are disabled by both components and DQ input termination is enabled by at least one of them. Consequently, the differential amplifier could never enter a meta-stable state, provided $\Delta V$ is large enough. However, this solution is not optimal for high-frequency signal transmission, for two reasons: (1) The delay between "low" to "high" and "high" to "low" transitions of the DQ signal through the differential amplifier would be different, resulting in longer input setup and hold time requirements (with respect to the clock used to latch the DQ signal) than if the delay for the two transitions were the same; and (2) The DQ signal waveform would not be symmetric with respect to VHF, resulting in less noise margin at the DQ input receiver than if the waveform were symmetric.

Both issues would effectively reduce the frequency at which DQ signals could be transmitted and compared if the pull-up and pull-down termination impedances were the same, and $V_{REF}$ were equal to $V_{DDQ}/2$. Accordingly, this solution is not optimal as compared to the following solutions.

Figure 1:
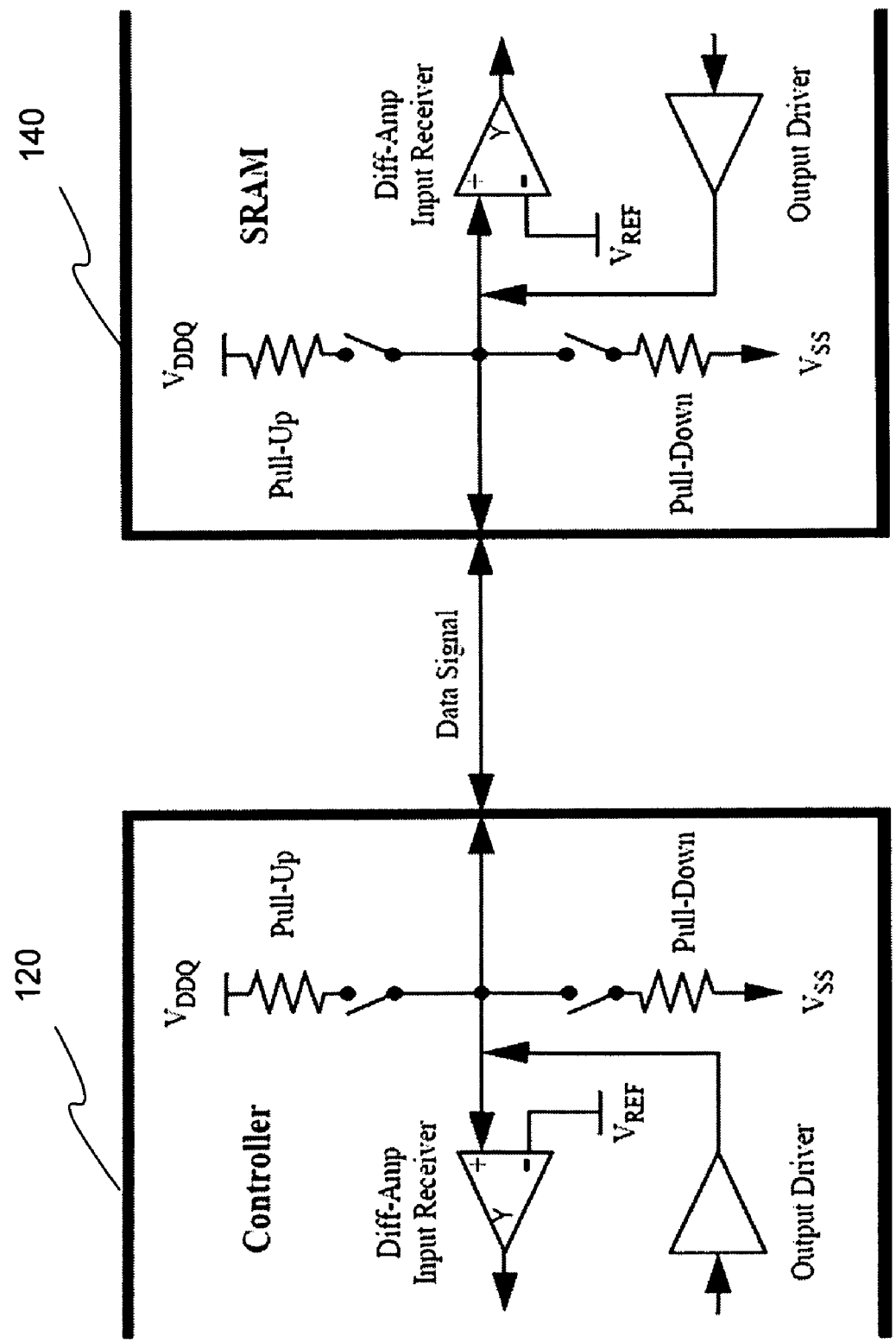
FIG. 1 is a schematic diagram illustrating ODT on a bi-directional data signal between SRAM and Controller.
Figure 3:
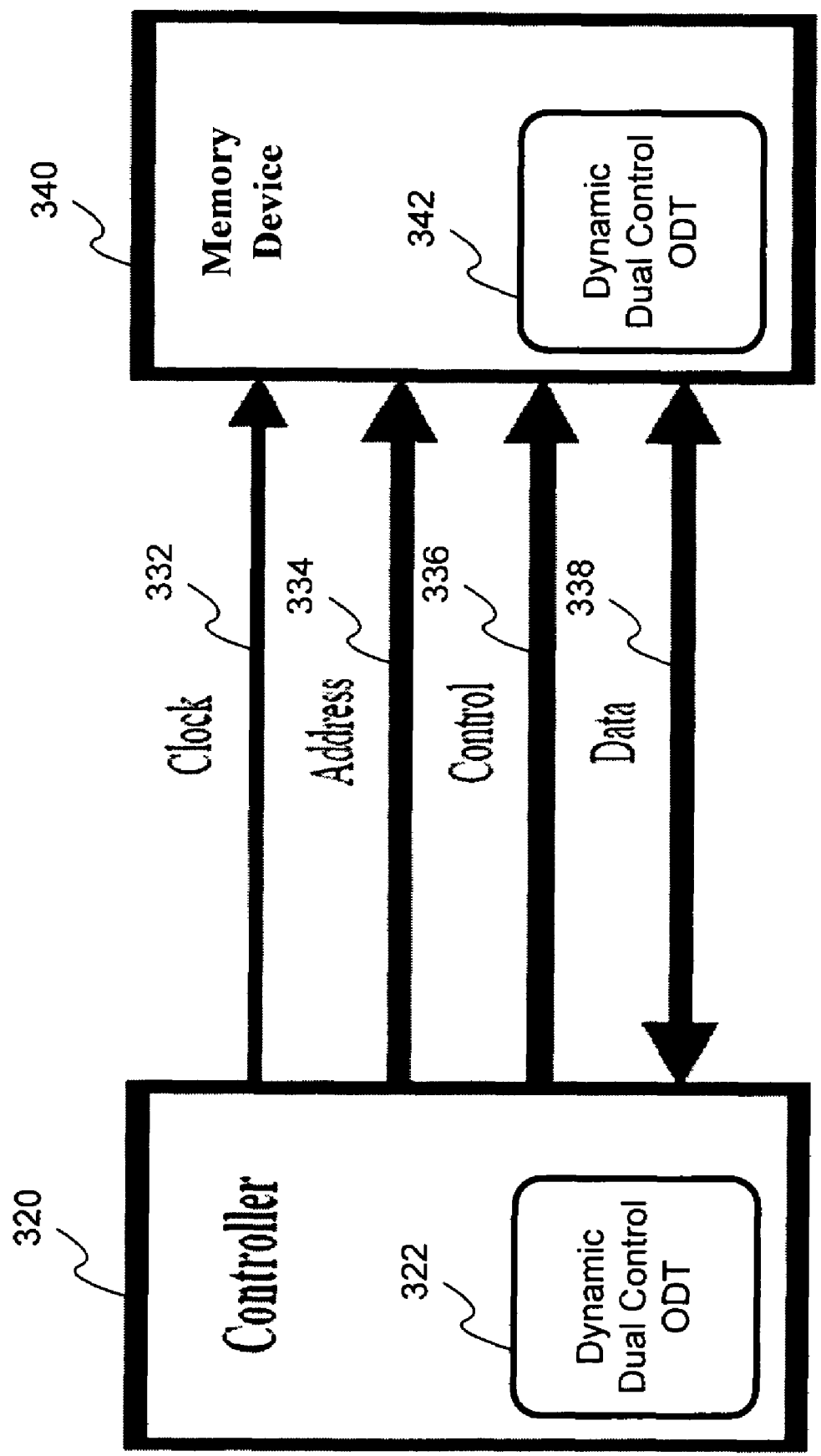
FIG. 3 is a block diagram illustrating an example of a system implementing dynamic dual control ODT.

FIG. 3 is a block diagram illustrating an example of a system 300 including a Controller 320 and Memory Device 340 that respectively implement dynamic dual control ODT 322, 342. As indicated, clock 332, address 334, control 336, and data bus 338 connections exist between the Controller 320 and the Memory Device 340. The clock 332, address 334, control 336 and data bus 338 connections respectively allow the Controller 320 to write to and read from the Memory Device 340 as introduced above.

By way of example, the Memory Device 340 may be SRAM, but it may be other forms of memory including but not necessarily limited to pseudo-SRAM, DRAM, flash memory, etc. Additionally, embodiments may be equally applicable to any component that interfaces to a second component via a bi-directional data bus, where both components implement on-die termination.

The Controller 320 and Memory Device 340 also include input termination pull-downs and input termination pull-ups as described above. The dynamic dual control ODT 322, 342 modules control the enabled/disabled status of the respective pull-ups and pull-downs and otherwise accommodate controlling the ODT on the bi-directional data bus as described herein. The dynamic dual control ODT 322, 342 functionalities may be embodied as hardware, firmware, software, or combinations thereof.

Specifically, according to this embodiment, the SRAM 340 and Controller 320 are configured such that the SRAM 340 and Controller 320 keep their respective input termination pull-downs enabled except when they drive data on the bi-directional data bus. That is, an enabled state is maintained for the set of input termination pull-downs of the Controller 320 except when data is driven on the bi-directional single ended data bus by the controller. Similarly, an enabled state is maintained for the set of input termination pull-downs of the Memory Device 340 except when data is driven on the bi-directional single ended data bus by the Memory Device 340.

Also according to this embodiment, both the Memory Device 340 and Controller 320 keep their respective input termination pull-ups disabled except while receiving data on the bus. According to one alternative, timing parameters are used to ensure that the input termination pull-ups are disabled except while receiving data.

According to another alternative, the read/write input control signal is used to ensure that the input termination pull-ups are disabled except while receiving data. Specifically, for example, a Synchronous Read/Write control input signal to the Memory Device is defined such that the Controller 320 can use it to signal the Memory Device 340 when to 1) enable its input termination pull-ups (prior to a Write operation or sequence of Write operations) and 2) disable its input termination pull-ups (after completion of a Write operation or sequence of Write operations), without affecting any of the memory device functions the input signal already controls. These features are variously implemented and further described in the following discussion.

Further discussion is now provided regarding an embodiment wherein the Controller writes to and reads from an SRAM memory device, although it is again noted that the same features may be provided regarding any memory device. FIG. 4 is a table 400 illustrating an example of the states of a Controller and SRAM and corresponding resultant DQ signal voltages. The table 400 includes columns corresponding to the SRAM DQ State 402, the Controller DQ State 404 and the Resulting DQ Signal Voltage 406, and the values corresponding to various different operational states.

In the table 400, "PD" refers to Pull-Down; "PU" refers to Pull-Up; "Off"=disabled; and "On"=enabled. Reference to Read "0" indicates the SRAM drives read data "low", and reference to Read "1" indicates the SRAM drives read data "high". Finally, Write "0" indicates the Controller drives write data "low", and Write "1" indicates the Controller drives write data "high".

Conceptually, this aspect of the present invention entails having the SRAM (and Controller) enable/disable its DQ output drivers and DQ input termination in such a way that the DQs are never pulled to $V_{REF}$. Specifically:

(1) The SRAM only enables its DQ output drivers when sending read data to the Controller. The Controller only enables its DQ output drivers when sending write data to the SRAM;

(2) The SRAM enables its DQ input termination pull-downs at all times, except when it enables its DQ output drivers. The Controller enables its DQ input termination pull-downs at all times, except when it enables its DQ output drivers; and (3) The SRAM enables its DQ input termination pull-ups sometime before receiving the first write data from the Controller. The SRAM disables its DQ input termination pull-ups sometime after receiving the last write data from the Controller. The Controller enables its DQ input termination pull-ups sometime before receiving the first read data from the SRAM. The Controller disables its DQ input termination pull-ups sometime after receiving the last read data from the SRAM.

Depending on the operation initiated by the Controller, this method of enabling/disabling DQ output drivers and DQ input termination results in the DQ signal voltages (406) illustrated in FIG. 4. As evident in the table 400, under no circumstances is $DQ = V_{DDQ}/2 = V_{REF}$.

Further details with regard to dynamic dual-control ODT implementation are now described. In particular, this aspect addresses implementation of Dynamic Dual-Control ODT in CIO SRAMs for any combination of SRAM Read Latency and Write Latency, for any amount of transmission delay from Controller to SRAM (and SRAM to Controller), and/or using interface signals between the devices.

SRAM DQ Input Termination Pull-Down Enable/Disable Control:

As explained previously, with the Dynamic Dual-Control ODT scheme, the SRAM must enable its DQ input termination pull-downs at all times except when it enables its DQ output drivers (to send read data to the Controller). This, for example, is implemented by having the SRAM disable its DQ input termination pull-downs (and enable its DQ output drivers) after detecting a Read operation, and enable its DQ input termination pull-downs (and disable its DQ output drivers) after detecting a non-Read operation.

In this case, the "Pull-Down Disable Latency" of the SRAM (i.e., the amount of time from when the SRAM detects a Read operation to when it disables its DQ input termination pull-downs (and enables its DQ output drivers)) is equal to the "Pull-Down Enable Latency" of the SRAM (i.e., the amount of time from when the SRAM detects a non-Read operation to when it enables its DQ input termination pull-downs (and disables its DQ output drivers)). Additionally, both are equal to the Read Latency of the SRAM; that is, PDDL=PDEL=RL.

This example may be especially useful since it can be used for any RL≧1 (all CIO SRAMs have a RL≧1).

SRAM DQ Input Termination Pull-Up Enable/Disable Control:

As explained previously, with the Dynamic Dual-Control ODT scheme, the SRAM must enable its DQ input termination pull-up sometime before receiving the first write data from the Controller, and keep it enabled until sometime after receiving the last write data from the Controller. One example of implementing this is using extended write latency, and another is using existing synchronous control inputs.

A. Extended Write Latency Example:

If the Write Latency of the SRAM is long enough, the SRAM can enable its DQ input termination pull-ups after detecting a Write operation, and disable its DQ input termination pull-ups after detecting a non-Write operation. However, in order to ensure optimal signal integrity, the SRAM must enable its DQ input termination before the Controller enables its DQ output drivers. In which case, the following timing parameters need to be considered:

1. Transmission delay of Write operation initiation, from Controller control output pins to SRAM control input pins. Typically 0.25~0.5 clock cycles, at high clock frequency.

2. Transmission delay of DQ input termination pull-up enable, from SRAM DQ pins to Controller DQ pins. Typically 0.25~0.5 clock cycles, at high clock frequency.

3. The setup time requirement of write data at the SRAM DQ pins to the input clock at the SRAM clock input pin. Typically 0.25~0.5 clock cycles, regardless of clock frequency.

Specifically, the "Pull-Up Enable Latency" of the SRAM (i.e., the amount of time from when the SRAM detects a Write operation to when it enables its DQ input termination pull-ups) must be less than the Write Latency of the SRAM minus the sum of these 3 item. That is, PUEL must be <WL−1.5 (considering the worst case value of the 3 items). PUEL=WL−2 is reasonable. And, since PUEL<1 is not really feasible at high frequency, WL must be ≧3 for this scheme to work properly.

Similarly, the SRAM must disable its DQ input termination pull-ups after the Controller disables its DQ output drivers. This, for example, is accomplished by having the "Pull-Up Disable Latency" of the SRAM (i.e., the amount of time from when the SRAM detects a non-Write operation to when it disables its DQ input termination pull-ups) be equal to the Write Latency of the SRAM. That is, PUDL=WL. That will ensure that the SRAM disables its DQ input termination pull-ups after the Controller disables its DQ output drivers, even if the transmission delay from Controller to SRAM (and SRAM to Controller) is 0 (which, of course, is not possible).

However, this implementation may not be ideal, because it requires that WL be a minimum value. An implementation that can be utilized for any WL≧1 is preferable, for more flexibility and because longer WL increases the design complexity of the SRAM rather significantly.

Existing Synchronous Control Inputs Example:

According to this aspect, the Synchronous Read/Write Select input signal is defined in such a way that the SRAM can use it to enable and disable its DQ input termination pull-up. Specifically:

(1) When the SRAM samples Synchronous Read/Write Select "high", it disables its DQ input termination pull-up (with a fixed "Pull-Up Disable Latency"), regardless of the state of Synchronous Enable; and (2) When the SRAM samples Synchronous Read/Write Select "low", it enables its DQ input termination pull-up (with a fixed "Pull-Up Enable Latency"), regardless of the state of Synchronous Enable.

It is noted that Synchronous Read/Write Select would still distinguish between Read and Write operations when Synchronous Enable is sampled "low".

FIG. 5 is a table 500 illustrating a CIO SRAM DQ Output Driver and DQ Input Termination Clock Truth Table according to this aspect of the present invention. The table includes entries for SA (502), LD (504), R/$\overline{W}$ (506), DQ Driver (508) and DQ Termination (510), and corresponding values for various operational states. "PUL" refers to the "Pull-Up Latency" of the SRAM. It is equal to the "Pull-Up Enable Latency" of the SRAM (i.e., PUEL, as described above) when R/$\overline{W}$=0, and it is equal to the "Pull-Up Disable Latency" of the SRAM (i.e., PUDL, as described above) when R/$\overline{W}$=1.

According to this aspect, Synchronous Read/Write Select would no longer be a "don't care" during NOP operations. Rather, it would distinguish between "NOPr" operations (i.e., NOP operations initiated by the Controller with Synchronous Read/Write Select driven "high") and "NOPw" operations (i.e. NOP operations initiated by the Controller with Synchronous Read/Write Select driven "low"). From a functionality standpoint, NOPr and NOPw would be identical, except for the impact to the state of the SRAM's DQ input termination pull-ups.

In this case, the "Pull-Up Enable Latency" of the SRAM (i.e., the amount of time from when the SRAM samples Synchronous Read/Write Select "low" to when it enables its DQ input termination pull-ups) can be equal to the "Pull-Up Disable Latency" of the SRAM (i.e. the amount of time from when the SRAM samples Synchronous Read/Write Select "high" to when it disables its DQ input termination pull-ups). That is, PUEL=PUDL=n, where n≧1.

It is noted that PUEL and PUDL don't necessarily have to be equal, but it is a reasonable implementation.

This aspect enables the Controller to initiate NOPw operations before a Write operation (however many are needed, given the WL and PUEL of the SRAM, and given the transmission delay from Controller to SRAM and SRAM to Controller) to ensure that the SRAM enables its DQ input termination pull-ups before the Controller enables its DQ output drivers. And, it enables the Controller to initiate NOPw operations after a Write operation (however many are needed, given the WL and PUDL of the SRAM, and given the transmission delay from Controller to SRAM and SRAM to Controller) to ensure that the SRAM keeps its DQ input termination pull-ups enabled until after the Controller disables its DQ output drivers.

This aspect also enables the Controller to initiate NOPr operations before a Read operation (however many are needed, given the RL and PUDL of the SRAM, and given the transmission delay from Controller to SRAM and SRAM to Controller) to ensure that the SRAM disables its DQ input termination pull-ups before the Controller enables its DQ input termination pull ups (to prepare to receive read data from the SRAM). And, it enables the Controller to initiate NOPr operations after a Read operation (however many are needed, given the RL and PUEL of the SRAM, and given the transmission delay from Controller to SRAM and SRAM to Controller) to ensure that the SRAM keeps its DQ input termination pull-ups disabled until after the Controller disables its DQ input termination pull-ups.

Controller DQ Input Termination Pull-Down Enable/Disable Control:

As explained previously, with the Dynamic Dual-Control ODT scheme, the Controller must enable its DQ input termination pull-downs at all times except when it enables its DQ output drivers (to send write data to the SRAM). This, for example, is implemented by having the Controller disable its DQ input termination pull-downs (and enable its DQ output drivers) after initiating a Write operation, and enable its DQ input termination pull-downs (and disable its DQ output drivers) after initiating a non-Write operation.

In this case, the "Pull-Down Disable Latency" of the Controller (i.e., the amount of time from when the Controller initiates a Write operation to when it disables its DQ input termination pull-downs (and enables its DQ output drivers)) can be equal to the "Pull-Down Enable Latency" of the Controller (i.e. the amount of time from when the Controller initiates a non-Write operation to when it enables its DQ input termination pull-downs (and disables its DQ output drivers)). And, both can be equal to the Write Latency of the SRAM minus 0.25~0.5 cycles (to meet the input setup time requirements of the SRAM). That is, PDDL=PDEL=WL−0.25~0.5. This is especially useful since it can be used for any WL≧1.

Controller DQ Input Termination Pull-Up Enable/Disable Control:

As explained previously, with the Dynamic Dual-Control ODT scheme, the Controller preferably enables its DQ input termination pull-up shortly before receiving the first read data from the SRAM, and keeps it enabled until shortly after receiving the last read data from the SRAM.

This, for example, may be implemented by having the Controller enable its DQ input termination pull-ups after initiating a Read operation, and disable its DQ input termination pull-ups after initiating a non-Read operation.

However, in order to ensure the best possible signal integrity, the Controller should enable its DQ input termination pull-ups before the SRAM enables its DQ output drivers. This is accomplished by having the "Pull-Up Enable Latency" of the Controller (i.e., the amount of time from when the Controller initiates a Read operation to when it enables its DQ input termination pull-ups) be equal to the Read Latency of the SRAM minus 0.5 cycles. That is, PUEL=RL−0.5. That will ensure that the Controller enables its DQ input termination pull-ups 0.5 cycles before the SRAM enables its DQ output drivers, even if the transmission delay from Controller to SRAM (and SRAM to Controller) is 0 (which, of course, is not possible).

Similarly, the Controller disables its DQ input termination pull-ups after the SRAM disables its DQ output drivers. In this case, the following timing parameters must be considered:

(1) Transmission delay of non-Read operation initiation, from Controller control output pins to SRAM control input pins. Typically 0.25~0.5 clock cycles, at high clock frequency; and (2) Transmission delay of DQ output driver disable, from SRAM DQ pins to Controller DQ pins. Typically 0.25~0.5 clock cycles, at high clock frequency.

Specifically, the "Pull-Up Disable Latency" of the Controller (i.e. the amount of time from when the Controller initiates a non-Read operation to when it disables its DQ input termination pull-ups) must be greater than the Read Latency of the SRAM plus the sum of these 2 items. That is, PUDL>RL+1.0 (considering the worst case value of the 2 items). PUDL=RL+1.5 is reasonable. This implementation is also useful since it can be used for any $RL \geq 1$.

Figure 6:
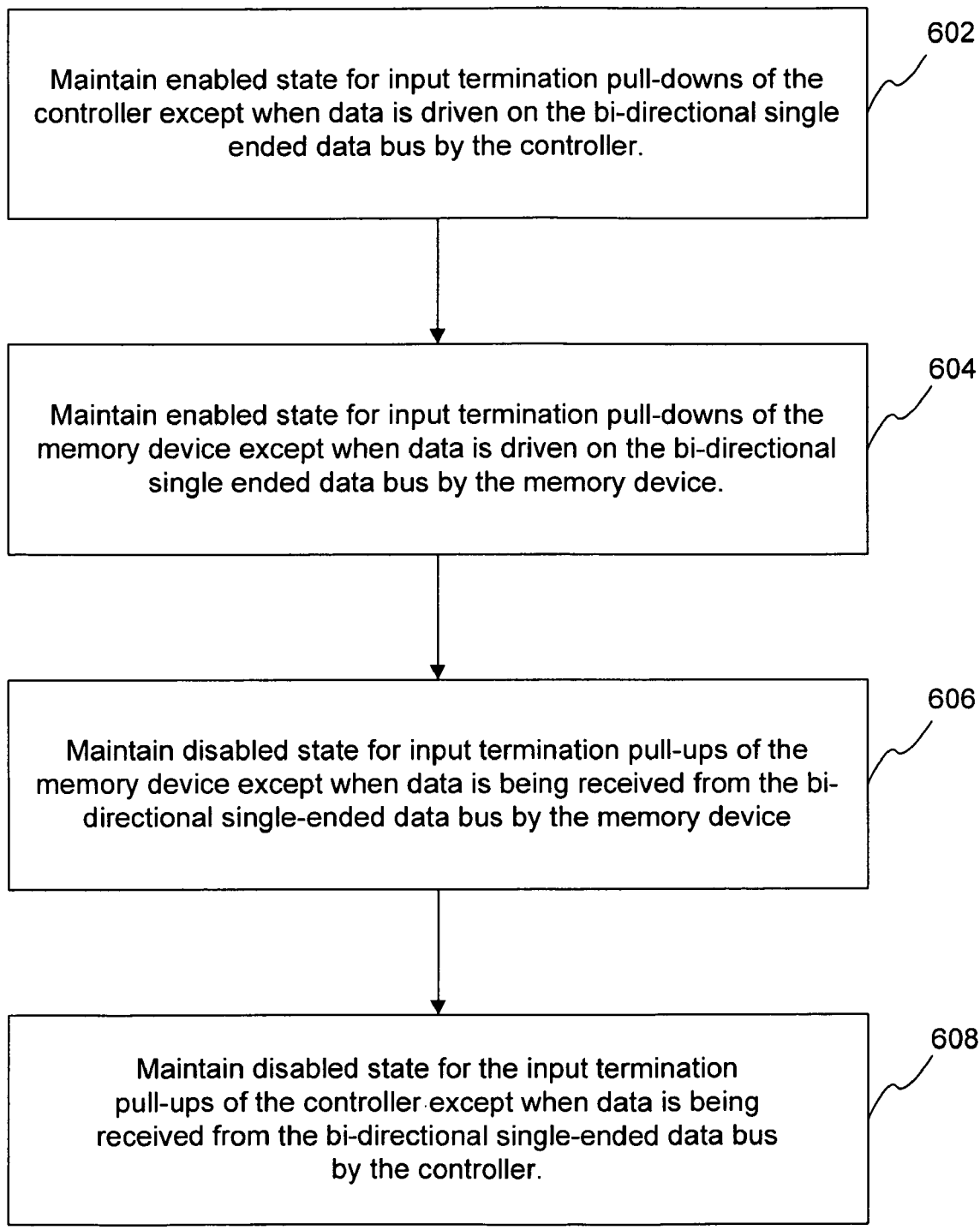
FIG. 6 is a flow diagram illustrating an example of a process for controlling on-die termination.

FIG. 6 is a flow diagram illustrating an example of a process 600 for controlling on-die termination on a bidirectional single-ended data bus carrying data between a controller and a memory device, wherein the controller and the memory device respectively include a set of input termination pull-ups and a set of input termination pull-downs.

The method entails maintaining 602 an enabled state for the set of input termination pull-downs of the controller except when data is driven on the bi-directional single ended data bus by the controller. Similarly, an enabled state is maintained 604 for the set of input termination pull-downs of the memory device except when data is driven on the bi-directional single ended data bus by the memory device. In conjunction with this a disabled state is maintained 606 for the input termination pull-ups of the memory device except when data is being received from the bi-directional single-ended data bus by the memory device, and a disabled state is maintained 608 for the input termination pull-ups of the controller except when data is being received from the bi-directional single-ended data bus by the controller.

A read/write input control signal of the memory device may be used to allow the controller to signal the memory device to enable the input termination pull-ups of the memory device in preparation for a write operation. Also, the read/write input control signal of the memory device may be used to allow the controller to signal the memory device to disable the input termination pull-ups of the memory device after completion of a write operation.

Alternatively, timing parameters may be used to ensure that the memory device enables the input termination pull-ups of the memory device before a set of output drivers of the controller are enabled for a write operation, and to ensure that the memory device disables the input termination pull-ups of the memory device after a set of output drivers of the controller are disabled upon completion of a write operation.

Figure 7:
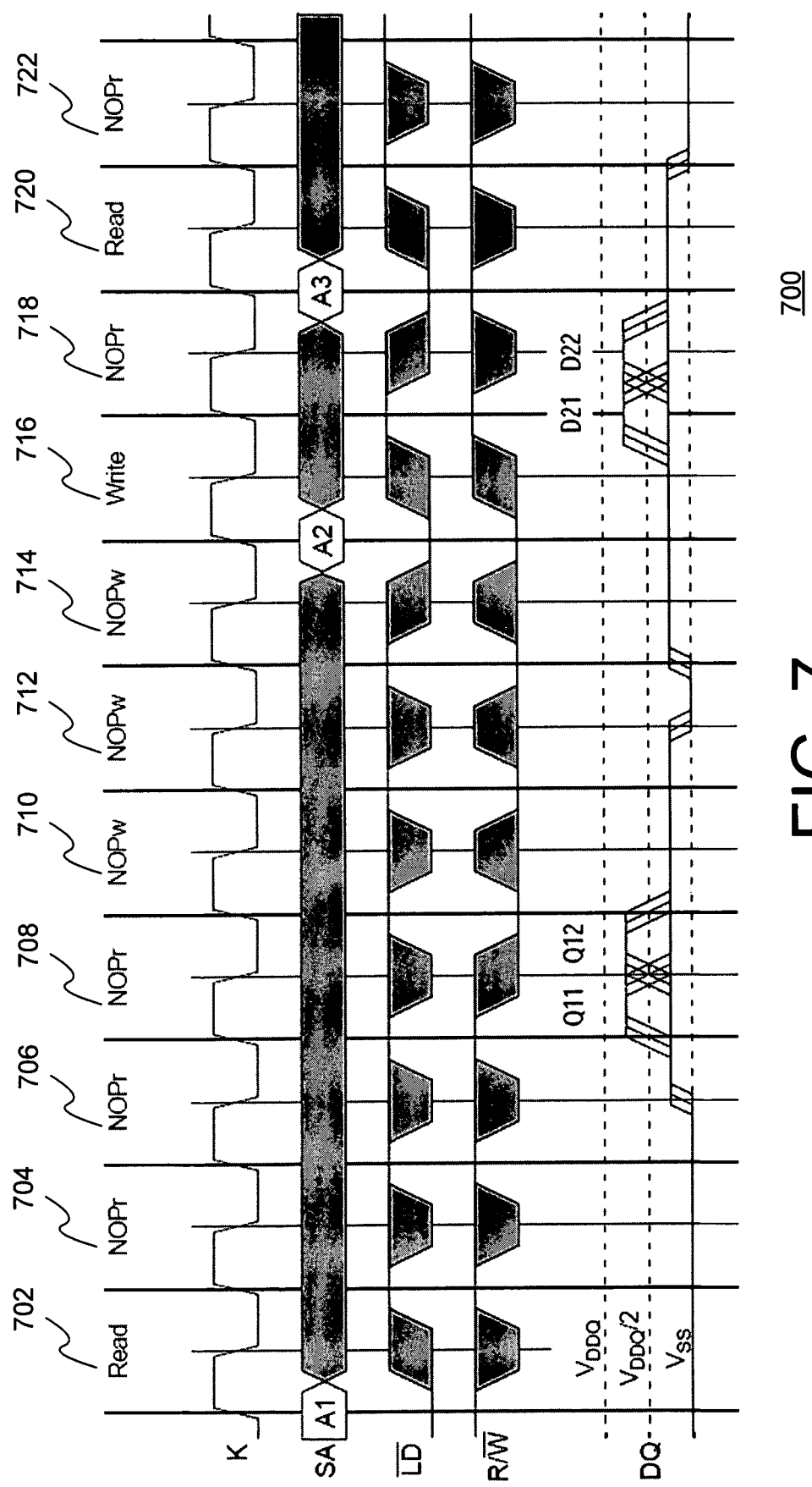
FIG. 7 is a timing diagram further illustrating timing for an example wherein Dynamic Dual Control ODT is implemented.

FIG. 7 is a timing diagram further illustrating the process and corresponding timing for an example wherein Dynamic Dual Control ODT is implemented. In the example, SRAM RL=3, WL=1, and PUEL=PUDL=2. The SRAM transmits and receives two pieces of data per clock cycle, per Read and Write operation. All signal timing is depicted at the SRAM pins. The reference to "drv"=output driver; "pd"=input termination pull-down; and "pu"=input termination pull-up. In the description below, "tPD" refers to the propagation trace delay from Controller to SRAM (and SRAM to Controller).

The timing diagram illustrates a series of clock cycles 702-722 and various corresponding operations. During a NOPr (706), the Controller enables DQ.pu from ↑K.180°. Thus, this occurs 2.5 cycles (i.e., @ RL−0.5 cycles) after initiating a Read operation, and 0.5 cycles before SRAM drives DQ valid (0 or 1). (0.5 cycles @ SRAM equals 0.5 cycles+2*tPD @ Controller.)

In the next cycle 708, during a NOPr, SRAM disables DQ.pd and enables DQ.drv, and drives DQ valid (0 or 1), at ↑K.0°. Thus this occurs 3 cycles (i.e. @ RL cycles) after detecting a Read operation.

In cycle 710, during a NOPw, SRAM enables DQ.pd and disables DQ.drv at ↑K.0°. Thus, this occurs 3 cycles (i.e. @ RL cycles) after detecting a non-Read operation (NOPr, in this case).

Then, still during a NOPw (712), Controller disables DQ.pu from ↑K.180°. This occurs 4.5 cycles (i.e., @ RL+1.5 cycles) after initiating a non-Read operation (NOPr, in this case) and 1.5 cycles after SRAM disables DQ.drv. (1.5 cycles @ SRAM equals 1.5 cycles−2*tPD @ Controller.)

In cycle 714, SRAM enables DQ.pu at ↑K.0°. This occurs 2 cycles (i.e. @ PUEL cycles) after sampling R/W̄=0 (in NOPw operation, in this case), 0.5 cycles after Controller disables DQ.pu. (0.5 cycles @ SRAM equals 0.5 cycles+2*tPD @ Controller.), and 1.75 cycles before Controller enables DQ.drv. (1.75 cycles @ SRAM equals 1.75 cycles−2*tPD @ Controller.)

In cycle 716, Controller disables DQ.pd and enables DQ.drv, and drives DQ valid (0 or 1), at ↑K.270°. This occurs 0.75 cycles (i.e., (WL−0.25 cycles) after initiating a Write operation.

In cycle 718, Controller enables DQ.pd and disables DQ.drv at ↑K.270°. This is 0.75 cycles (i.e. @ WL−0.25 cycles) after initiating a non-Write operation (NOPr, in this case).

Finally, at the transition spanning the end of cycle 720 to the beginning of cycle 722, SRAM disables DQ.pu at ↑K. This is 2 cycles (i.e., @ PUDL cycles) after sampling R/W̄=1 (in NOPr operation, in this case), 1.25 cycles after Controller disables DQ.drv (1.25 cycles @ SRAM equals 1.25 cycles+2*tPD @ Controller.), and 1.5 cycles before Controller enables DQ.pu. (1.5 cycles (SRAM equals 1.5 cycles−2*tPD @ Controller.)

Thus embodiments of the present invention produce and provide dynamic dual control on-die termination. Although the present invention has been described in considerable detail with reference to certain embodiments thereof, the invention may be variously embodied without departing from the spirit or scope of the invention. Therefore, the following claims should not be limited to the description of the embodiments contained herein in any way.

The invention claimed is:

1. A method for controlling on-die termination on a bi-directional single-ended data bus carrying data between a controller and a memory device, wherein the controller and the memory device respectively include a set of input termination pull-ups and a set of input termination pull-downs, the method comprising:

maintaining an enabled state for the set of input termination pull-downs of the memory device except when data is driven on the bi-directional single ended data bus by the memory device; and maintaining a disabled state for the input termination pull-ups of the memory device except when data is being received from the bi-directional single-ended data bus by the memory device.

2. The method for controlling on-die termination on a bi-directional single-ended data bus according to claim 1, further comprising:

maintaining an enabled state for the set of input termination pull-downs of the controller except when data is driven on the bi-directional single ended data bus by the controller; and maintaining a disabled state for the input termination pull-ups of the controller except when data is being received from the bi-directional single-ended data bus by the controller.

3. The method for controlling on-die termination on a bi-directional single-ended data bus according to claim 1, further comprising:

using a read/write input control signal of the memory device to allow the controller to signal the memory device to enable the input termination pull-ups of the memory device in preparation for a write operation.

4. The method for controlling on-die termination on a bi-directional single-ended data bus according to claim 3, further comprising:

using the read/write input control signal of the memory device to allow the controller to signal the memory device to disable the input termination pull-ups of the memory device after completion of a write operation.

5. The method for controlling on-die termination on a bi-directional single-ended data bus according to claim 1, further comprising:

using timing parameters to ensure that the memory device enables the input termination pull-ups of the memory device before a set of output drivers of the controller are enabled for a write operation.

6. The method for controlling on-die termination on a bi-directional single-ended data bus according to claim 5, further comprising:

using timing parameters to ensure that the memory device disables the input termination pull-ups of the memory device after a set of output drivers of the controller are disabled upon completion of a write operation.

7. The method for controlling on-die termination on a bi-directional single-ended data bus according to claim 2, wherein maintaining the enabled state for the set of input termination pull-downs of the controller comprises:

enabling the set of input termination pull-downs of the controller; and disabling the set of input termination pull-downs of the controller when a set of output drivers for the controller are enabled.

8. The method for controlling on-die termination on a bi-directional single-ended data bus according to claim 1, wherein maintaining the enabled state for the set of input termination pull-downs of the memory device comprises:

enabling the set of input termination pull-downs of the memory device; and disabling the set of input termination pull-downs of the memory device when a set of output drivers for the memory device are enabled.

9. The method for controlling on-die termination on a bi-directional single-ended data according to claim 1, wherein the memory device is a static random access memory device.

10. A memory device having on-die termination control wherein the memory device communicates with a controller on a bi-directional single-ended data bus carrying data between the controller and the memory device, the memory device comprising:

a set of input termination pull-ups;

a set of input termination pull-downs; and a dual control on-die termination module, in operative communication with the set of input termination pull-ups and the set of input termination pull-downs, the dual control on-die termination module configured to maintain an enabled state for the set of input termination pull-downs except when data is driven on the bi-directional single ended data bus by the memory device, and maintain a disabled state for the input termination pull-ups of the memory device except when data is being received from the bi-directional single-ended data bus by the memory device.

11. The memory device of claim 10, wherein a read/write input control signal of the memory device allows the controller to signal the memory device to enable the input termination pull-ups in preparation for a write operation.

12. The memory device of claim 11, wherein the read/write input control signal of the memory device is used to allow the controller to signal the memory device to disable the input termination pull-ups of the memory device after completion of a write operation.

13. The memory device of claim 10, wherein timing parameters are used to ensure that the memory device enables the input termination pull-ups before a set of output drivers of the controller are enabled for a write operation.

14. The memory device of claim 13, wherein timing parameters are used to ensure that the memory device disables the input termination pull-ups after the set of output drivers of the controller are disabled upon completion of a write operation.

15. The memory device of claim 10, wherein the enabled state for the set of input termination pull-downs is maintained by enabling the set of input termination pull-downs of the memory device, and disabling the set of input termination pull-downs of the memory device when a set of output drivers for the memory device are enabled.

16. The memory device of claim 10, wherein the memory device is a static random access memory device.

17. A controller having on-die termination control wherein the controller communicates with a memory device on a bi-directional single-ended data bus carrying data between the controller and the memory device, the controller comprising:

a set of input termination pull ups;

a set of input termination pull downs; and a dual control on-die termination module, in operative communication with the set of input termination pull-ups and the set of input termination pull-downs, the dual control on-die termination module configured to maintain an enabled state for the set of input termination pull-downs except when data is driven on the bi-directional single ended data bus by the controller, and maintain a disabled state for the input termination pull-ups of the memory device except when data is being received from the bi-directional single-ended data bus by the controller.

18. The controller of claim 17, wherein timing parameters are used to ensure that the memory device enables a set of input termination pull-ups of the memory device before a set of output drivers of the controller are enabled for a write operation.

19. The controller of claim 18, wherein timing parameters are used to ensure that the memory device disables a set of input termination pull-ups of the memory device after the set of output drivers of the controller are disabled upon completion of a write operation.

20. The controller of claim 17, wherein the enabled state for the set of input termination pull-downs is maintained by enabling the set of input termination pull-downs, and disabling the set of input termination pull-downs when a set of output drivers for the controller are enabled.

21. A system for controlling on-die termination on a bi-directional single-ended data bus carrying data between a controller and a memory device, wherein the controller and the memory device respectively include a set of input termination pull-ups and a set of input termination pull-downs, the system comprising:

means for maintaining an enabled state for the set of input termination pull-downs of the memory device except when data is driven on the bi-directional single ended data bus by the memory device; and means for maintaining a disabled state for the input termination pull-ups of the memory device except when data is being received from the bi-directional single-ended data bus by the memory device.

22. The system of claim 21, further comprising:

means for maintaining an enabled state for the set of input termination pull-downs of the controller except when data is driven on the bi-directional single ended data bus by the controller; and means for maintaining a disabled state for the input termination pull-ups of the controller except when data is being received from the bi-directional single-ended data bus by the controller.

23. The system of claim 21, further comprising:

means for using a read/write input control signal of the memory device to allow the controller to signal the memory device to enable the input termination pull-ups of the memory device in preparation for a write operation.

24. The system of claim 23, further comprising:

means for using the read/write input control signal of the memory device to allow the controller to signal the memory device to disable the input termination pull-ups of the memory device after completion of a write operation.

25. The system of claim 21, further comprising:

means for using timing parameters to ensure that the memory device enables the input termination pull-ups of the memory device before a set of output drivers of the controller are enabled for a write operation.

26. The system of claim 21, further comprising:

means for using timing parameters to ensure that the memory device disables the input termination pull-ups of the memory device after a set of output drivers of the controller are disabled upon completion of a write operation.

* * * * *